United States Patent
Zang et al.

(10) Patent No.: US 9,460,996 B1
(45) Date of Patent: Oct. 4, 2016

(54) INTEGRATED DEVICE WITH INDUCTIVE AND CAPACITIVE PORTIONS AND FABRICATION METHODS

(71) Applicant: GLOBALFOUNDRIES Inc., Grand Cayman (KY)

(72) Inventors: Hui Zang, Guilderland, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/818,351

(22) Filed: Aug. 5, 2015

(51) Int. Cl.
*H01L 23/522* (2006.01)
*H01L 23/528* (2006.01)
*H01L 49/02* (2006.01)

(52) U.S. Cl.
CPC ......... *H01L 23/5227* (2013.01); *H01L 23/528* (2013.01); *H01L 23/5222* (2013.01); *H01L 28/10* (2013.01); *H01L 28/60* (2013.01)

(58) Field of Classification Search
CPC ........... H01L 2/5223; H01L 23/52127; H01L 23/528; H01L 23/522; H01F 17/04
See application file for complete search history.

(56) References Cited

U.S. PATENT DOCUMENTS 5,903,151 A * 5/1999 Potthast ............. G01R 33/3621
324/318
6,211,056 B1 * 4/2001 Begley ................ H01L 21/7682
257/531
8,552,812 B2 10/2013 Yen et al.
2014/0062636 A1 * 3/2014 Yang ....................... H01F 17/04
336/83

OTHER PUBLICATIONS

T. Charania et al., Analysis and Design of On-Chip Decoupling Capacitors, IEEE, VLST Systems, V. 21, No. 4, p. 648, 2013.
P.Y. Chiu, M.D. Ker, Metal-Layer Cap in 65nm CMOS for Low-Leakage Power-Rail ESD Clamp Circuit, Microelectronics Reliability 54, pp. 64-70, 2014.

* cited by examiner

Primary Examiner — Phuc Dang
(74) Attorney, Agent, or Firm — Heslin Rothenberg Farley and Mesiti PC; Nicholas Mesiti

(57) ABSTRACT

Integrated devices and fabrication methods thereof are presented. The methods include, for instance fabricating an integrated device comprising an inductive portion and a capacitive portion, the integrated device being at least partially embedded within an electrode. The fabricating includes providing a conductive coil at least partially within an insulator layer above a substrate, the conductive coil comprising exposed portions, wherein the inductive portion of the integrated device comprises the conductive coil; covering exposed portions of the conductive coil with a dielectric material; and forming the electrode at least partially around the dielectric covered portions of the conductive coil, the electrode being physically separated from the conductive coil by the dielectric material, wherein the capacitive portion of the integrated device comprises the electrode, the dielectric material, and the conductive coil. In one embodiment, the method further includes: exposing at least one further portion of the conductive coil; and providing another electrode in electrical contact with the at least one exposed further portion of the conductive coil.

20 Claims, 8 Drawing Sheets

US 9,460,996 B1

INTEGRATED DEVICE WITH INDUCTIVE AND CAPACITIVE PORTIONS AND FABRICATION METHODS

FIELD OF THE INVENTION

The present invention relates to integrated devices and methods of fabricating integrated devices, and more particularly to integrated devices having inductive and capacitive portions.

BACKGROUND OF THE INVENTION

The electronics industry continues to pursue integrated circuits with enhanced performance and increased density to meet consumer demand. Capacitors and inductors are key required devices for the fabrication of integrated circuits. Typically, an inductor includes a coil of conductive material, and a capacitor includes two electrodes separated by a dielectric material, e.g., a parallel plate capacitor.

As semiconductor device critical dimensions have been reduced in order to increase the density of integrated circuits, traditional capacitor and inductor designs have exhibited scaling problems. These scaling problems include, for example, increases in resistance and leakage currents, and reductions in capacitance and fabrication yield.

For instance, reducing the size of a capacitor may cause a reduction in the amount of conductive material used in the capacitor and associated contact structures, increasing the resistance of the capacitor. In addition, the reduction in size may lead to a reduction in the amount of dielectric material, reducing the capacitance of the capacitor.

Further, radio frequency applications typically require multiple oscillator circuits, which may be implemented using inductors and capacitors. Fabrication techniques that produce separate inductors and capacitors require increased wafer area on an integrated circuit or chip.

BRIEF SUMMARY

The shortcomings of the prior art are overcome, and additional advantages are provided, through the provision, in one aspect, of a method. The method includes: fabricating an integrated device including an inductive portion and a capacitive portion. The fabricating includes: providing a conductive coil at least partially within an insulator layer above a substrate, the conductive coil including exposed portions, where the inductive portion of the integrated device includes the conductive coil; covering exposed portions of the conductive coil with a dielectric material; and forming the electrode of the integrated device at least partially around the dielectric covered portions of the conductive coil, the electrode being physically separated from the conductive coil by the dielectric material, where the capacitive portion of the integrated device includes the electrode, the dielectric material, and the conductive coil.

In another aspect, an integrated device is presented. The integrated device includes: a conductive coil, the conductive coil including an inductive portion of the integrated device; a dielectric material, the dielectric material covering exposed portions of the conductive coil; and an electrode, the electrode being disposed at least partially around the dielectric covered portions of the conductive coil and being physically separated from the conductive coil by the dielectric material, where a capacitive portion of the integrated device includes the electrode, the dielectric material, and the conductive coil.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
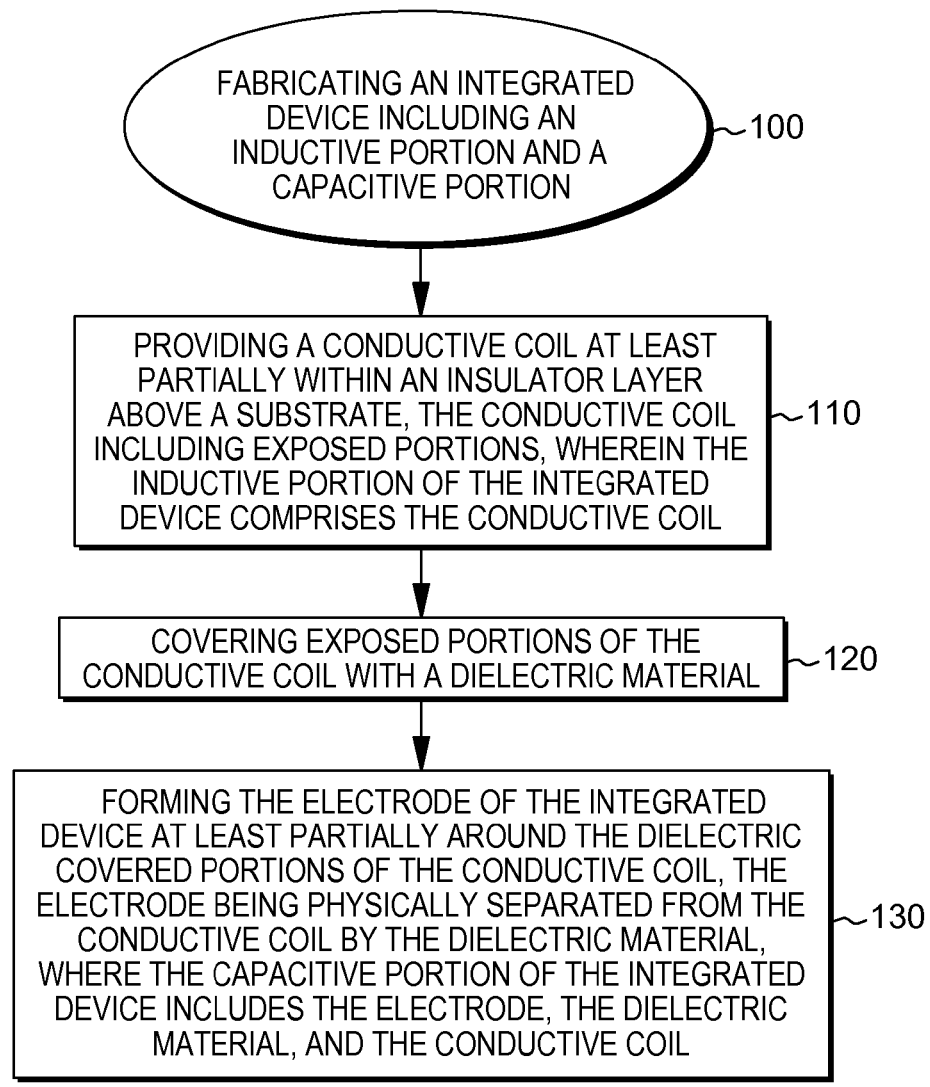
FIG. 1 depicts embodiments of a process for fabricating an integrated device, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure provides, in part, integrated devices having both an inductive and a capacitive portion, facilitating reduction of wafer surface area required for the creation of certain oscillator or resonant circuits because a combined integrated device may be provisioned in a smaller area than the sum of two distinct devices. Also, the present disclosure provides integrated devices with inductive coils, for example, embedded within an electrode of the integrated device, allowing enhanced performance and improved fabrication efficiency.

For instance, a resonant circuit or LC (inductor-capacitor) circuit, may include an inductor and a capacitor electrically connected in parallel or series. An inductor and a capacitor are each two-terminal devices. Therefore, a circuit with one distinct inductor and one distinct capacitor may have a total of four terminals. But, if a single integrated device has both an inductance and a capacitance, the integrated device may only have two terminals. In such a way, the amount of wafer surface area occupied by LC circuits may be reduced through the provision of an integrated device as disclosed herein.

Further, as semiconductor device critical dimensions have been reduced in order to increase the density of integrated circuits, traditional inductor and capacitor designs have exhibited scaling problems. These scaling problems include, for example, increases in resistance and leakage currents, and reductions in capacitance and fabrication yield.

For instance, reducing the size of a device, such as an inductor or a capacitor, leads to a reduction in the amount of conductive material used in the device and associated contact structures, increasing the resistance of the device. In addition, the reduction in size of a capacitor leads to a reduction in the amount of dielectric material, reducing the capacitance of the capacitor.

Advantageously, the present disclosure provides integrated devices in which a conductive coil may act, in part, as both an inductive element and a capacitive element.

Generally stated, provided herein, in one aspect, is an integrated device. The integrated device includes, for instance: a conductive coil, the conductive coil including an inductive portion of the integrated device; a dielectric material, the dielectric material covering exposed portions of the conductive coil; and an electrode, the electrode being disposed at least partially around the dielectric covered portions of the conductive coil and being physically separated from the conductive coil by the dielectric material, where a capacitive portion of the integrated device includes the electrode, the dielectric material, and the conductive coil.

In one embodiment, the integrated device further includes another electrode, the other electrode being in electrical contact with at least one further portion of the conductive coil. In another embodiment, the integrated device further includes a liner material, the liner material being disposed over the dielectric covered portions of the conductive coil and inhibiting damage to the dielectric material from the electrode. In a further embodiment, the conductive coil is aligned with an axis substantially parallel to an upper surface of the insulator layer.

In one embodiment, the conductive coil is aligned with an axis substantially perpendicular to an upper surface of the insulator layer. In another embodiment, the integrated device further includes at least one interconnect structure, the at least one interconnect structure connecting the inductive portion and the capacitive portion of the integrated device in a series electrical connection. In another embodiment, the integrated device further includes at least one interconnect structure, the at least one interconnect structure connecting the inductive portion and the capacitive portion of the integrated device in a parallel electrical connection. In a further embodiment, the conductive coil is substantially coplanar with an upper surface of the insulator layer.

Reference is made below to the drawings, which are not drawn to scale for ease of understanding, wherein the same reference numbers used throughout different figures designate the same or similar components.

FIG. 1 depicts embodiments of a process for fabricating an integrated device having an inductive portion and a capacitive portion 100, in accordance with one or more aspects of the present invention.

In one embodiment, the fabricating 100 includes: providing a conductive coil at least partially within an insulator layer above a substrate, where the inductive portion of the integrated device includes the conductive coil 110; covering exposed portions of the conductive coil with a dielectric material 120; and forming the electrode of the integrated device at least partially around the dielectric covered portions of the conductive coil, the electrode being physically separated from the conductive coil by the dielectric material, where the capacitive portion of the integrated device includes the electrode, the dielectric material, and the conductive coil 130.

In another embodiment, the fabricating 100 further includes exposing at least one further portion of the conductive coil; and providing another electrode in electrical contact with the at least one exposed further portion of the conductive coil. In a further embodiment, the providing 110 includes forming the conductive coil within a cavity of the insulator layer, where the exposed portions of the conductive coil are exposed within the cavity of the insulator layer. In such a case, for example, the forming may include filling the cavity of the insulator layer with the electrode. In another example, the providing 110 includes removing portions of the insulator layer to form the cavity and expose the exposed portions of the conductive coil.

In one embodiment, the providing 110 includes forming trenches in the insulator layer; forming a conductive coil within the trenches of the insulator layer; and etching the insulator layer to expose the exposed portions of the conductive coil. In such a case, the etching may include laterally etching the insulator layer to facilitate exposing lower portions of the conductive coil.

In another embodiment, the fabricating 100 further includes disposing, after the covering, a liner material over the dielectric covered portions of the conductive coil, the liner material inhibiting damage to the dielectric material during the forming. In a further embodiment, the providing 110 includes aligning the conductive coil with an axis substantially parallel to an upper surface of the insulator layer.

In one embodiment, the providing 110 includes aligning the conductive coil with an axis substantially perpendicular to an upper surface of the insulator layer. In another embodiment, the fabricating 100 further includes forming at least one interconnect structure, where the at least one interconnect structure connects the inductive portion and the capacitive portion of the integrated device in a series electrical connection. In another embodiment, the fabricating 100 further includes forming at least one interconnect, where the at least one interconnect structure connects the inductive portion and the capacitive portion of the integrated device in a parallel electrical connection. In a further embodiment, the forming includes at least partially embedding the conductive coil within the electrode of the integrated device.

Figure 2A:
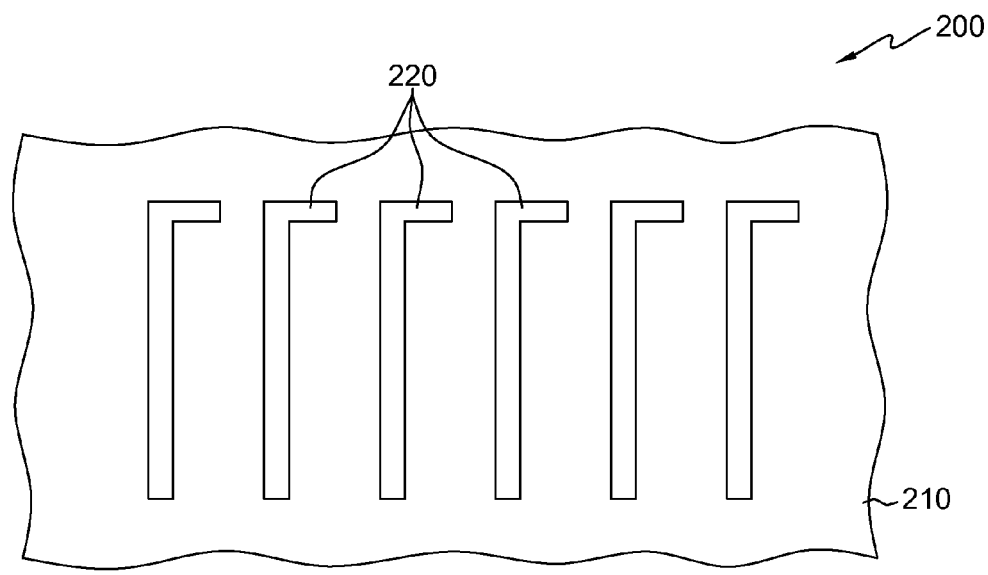
FIG. 2A is a plan view of a structure found in integrated device fabrication, in accordance with one or more aspects of the present invention.

FIG. 2A is a plan view of a structure 200 found in integrated device fabrication, in accordance with one or more aspects of the present invention.

By way of explanation, in a semiconductor fabrication process, semiconductor devices may be formed within a first (lower level) over a substrate. Next, the formed semiconductor devices may be connected using a series of metallization layers, labeled, for example, M1, M2 . . . M9, M10, and so forth. Each metallization layer includes a series of conductive connective lines that form connections between the elements of the layer below, such as devices or contact areas. As each metallization layer is formed, connections between metallization layers may be formed by using vias, which are vertical contact structures that extend from one metallization layer to another, or from the device layer to a metallization layer, and may be labeled as V0, V1, V2 . . . V8, V9, V10, and so forth. For example, each metallization layer and each via level may be formed using photolithographic patterning, masking, and etching techniques, by the use of an appropriate set of masks.

In the embodiment of FIG. 2A, structure 200 includes an insulator layer 210, and trenches 220. In one embodiment, the integrated devices described herein are formed near the back end of line (BEOL), e.g., during formation of M9 and M10 metallization layers. In such a case, semiconductor devices such as transistors will be formed from a semiconductor substrate located below the insulator layer and will reside below the formed integrated devices. For ease of illustration, such underlying semiconductor devices are not depicted herein, and structure 200 may include numerous such layers below the illustrated portions.

FIGS. 2A-2E describe one or more embodiments of a process for providing a conductive coil, which may be carried out, in one example, using processes for forming metallization layers and vias, without introducing additional process or mask steps. Advantageously, integrated devices as described herein may therefore be fabricated with little or no additional processing steps, allowing for elimination of process steps previously used to form capacitors and/or inductors. In one example, trenches 220 may be formed using a masking step used for the formation of an M1 metallization layer. In another example, an integrated device as described herein may be formed concurrent with the formation of metallization layers and vias for connecting semiconductor devices.

In one embodiment, trenches 220 may be formed by photolithographic masking of insulator layer 210 followed by etching, such as anisotropic or directional etching. In another embodiment, multiple layers may be located below insulator layer 210, such as a semiconductor substrate, device layers, etc.

In one or more embodiments, the semiconductor substrate can be a bulk semiconductor material such as a bulk silicon wafer. In another embodiment, the substrate can include silicon (Si), single crystal Si, polycrystalline Si, amorphous Si, Si-on-nothing (SON), Si-on-insulator (SOI), or Si-on-replacement insulator (SRI). In a further embodiment, the substrate can be n-type or p-type doped. In such a case, the substrate may be doped, or various regions may be n-type and p-type doped to form various n-wells and p-wells. In one particular example, the substrate can have a thickness of less than or equal to 0.1 micrometers. In one example, a passivation layer may be or include silicon nitride. In another example, an insulator layer may be or include tetraethyl orthosilicate (TEOS).

Figure 2B:
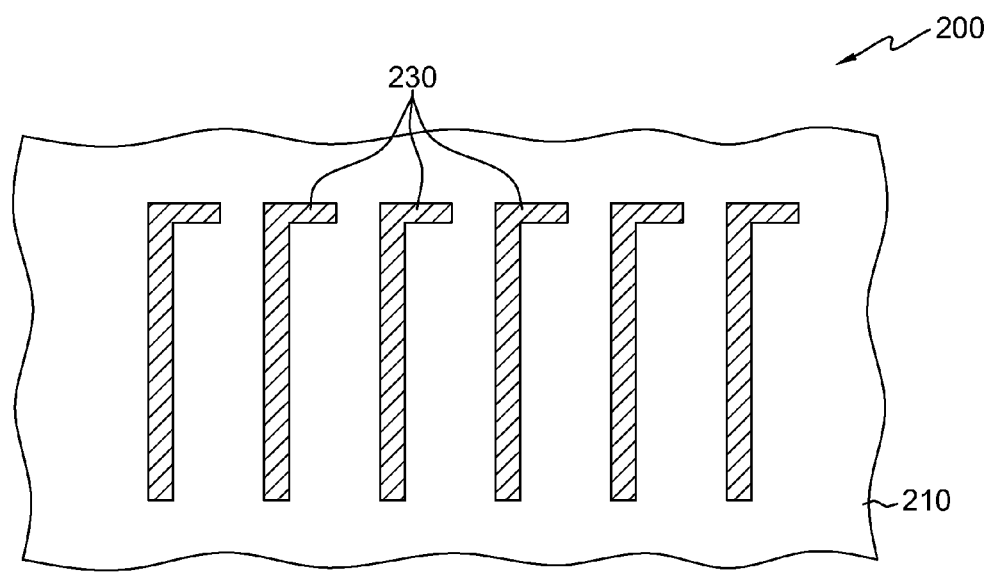
FIG. 2B depicts the structure of FIG. 2A, after forming a portion of a conductive coil within trenches of an insulator layer, in accordance with one or more aspects of the present invention.

FIG. 2B depicts structure 200, after forming a portion of a conductive coil 230 within trenches of insulator layer 210, in accordance with one or more aspects of the present invention. In one embodiment, an isolation material may be provided in the bottoms of trenches 220 (FIG. 2A) before forming conductive coil 230, and may be used to assist in a subsequent etching process steps described herein.

In one or more embodiments, L-shaped segments of conductive coil 230 may be deposited in a first level of insulator layer 210, with subsequent process steps used to facilitate formation of a completed, looping coil structure.

In one embodiment, conductive coil may be or include copper, or any suitable conductive material or metal, and any suitable deposition process may be employed. For example, conductive coil 230 may be formed by filling structure 200 with an electrode material, followed by chemical mechanical planarization (CMP) of the surface so that conductive coil 230 has the desirable size and height depicted in FIG. 2B.

In one example, the conductive coil may be spaced apart with a characteristic spacing. In another example, the conductive coil may be aligned to be substantially parallel and coplanar. In other example, the conductive coil may be arranged in other manners, such as perpendicular to each other, in a random arrangement, etc.

Figure 2C:
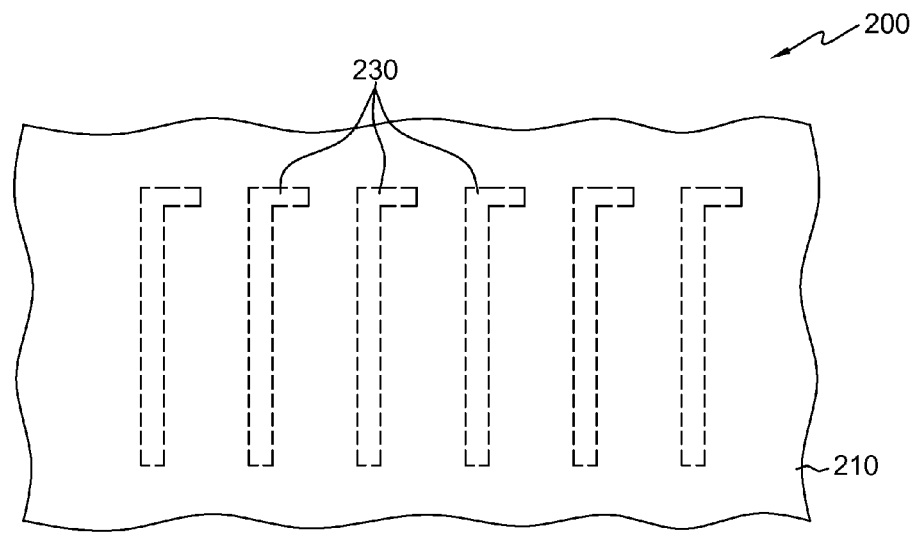
FIG. 2C depicts the structure of FIG. 2B, after filling the insulator layer, in accordance with one or more aspects of the present invention.

FIG. 2C depicts structure 200, after extending or filling insulator layer 210, in accordance with one or more aspects of the present invention. For example, insulator layer 210 may be expanded over conductive coil 230. In one embodiment, the insulator layer may be filled using an insulator material, such as TEOS, which is the same or different as previously used for insulator layer 210.

In one or more embodiments, insulator layer 210 is filled over conductive coil 230 so as to be completely dispose conductive coil 230 within insulator layer 210, to facilitate subsequent processing steps to expose some portions of conductive coil 230, as explained below.

Figure 2D:
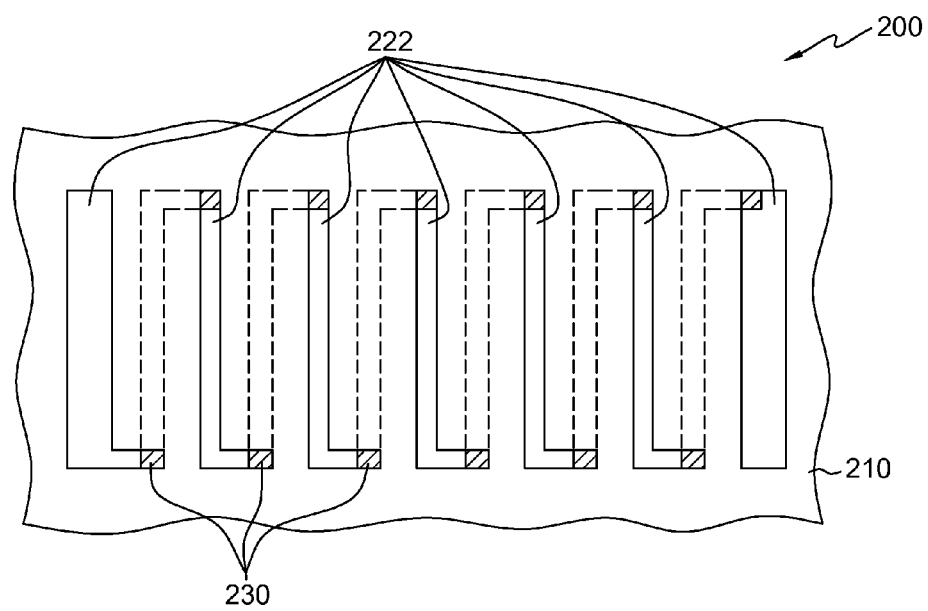
FIG. 2D depicts the structure of FIG. 2C, after form trenches in the insulator layer, in accordance with one or more aspects of the present invention.

FIG. 2D depicts structure 200, after forming trenches 222 in insulator layer 210, in accordance with one or more aspects of the present invention. In one embodiment, the trenches are L-shaped and aligned in such a way as to expose certain portions of prior-formed conductive coil 230.

In one or more embodiments, a via formation process is used to form the parts of trenches 222 that expose the certain portions of prior-formed portions of conductive coil 230, and a next level metallization process is used to form the other parts of trenches 222 that do not expose prior formed portions of conductive coil 230. For example, as explained above, via and metallization processes may be employed to form other devices, such as transistors at the same time as conductive coil 230, by, e.g., appropriate modification of photolithographic mask sets.

Figure 2E:
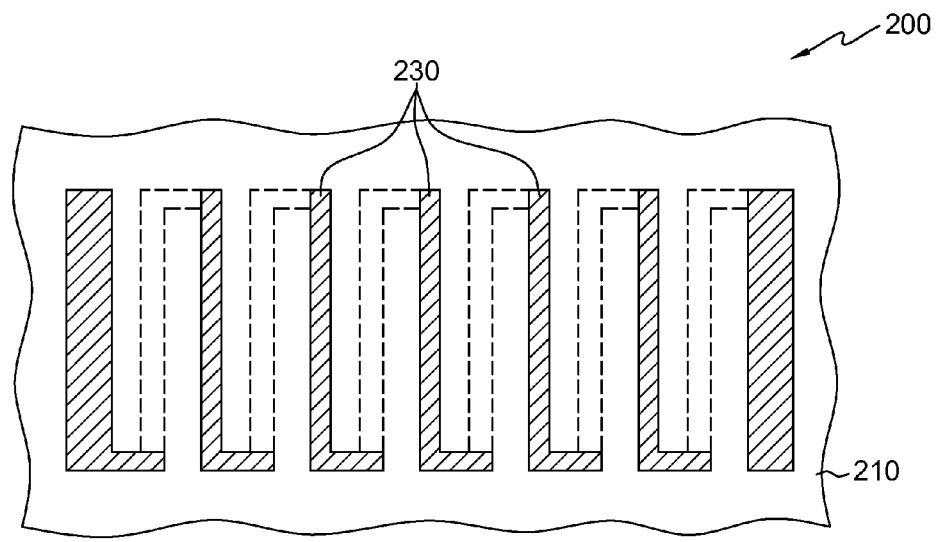
FIG. 2E depicts the structure of FIG. 2D, after forming another portion of the conductive coil within the trenches of the insulator layer, in accordance with one or more aspects of the present invention.

FIG. 2E depicts structure 200, after forming another portion of conductive coil 230 within trenches 220 (FIG. 2D) of insulator layer 210, in accordance with one or more aspects of the present invention. In one embodiment, conductive coil 230 may be formed to span multiple metallization levels, and have numerous loops, depending upon specific design requirements for inductance.

Figure 2F:
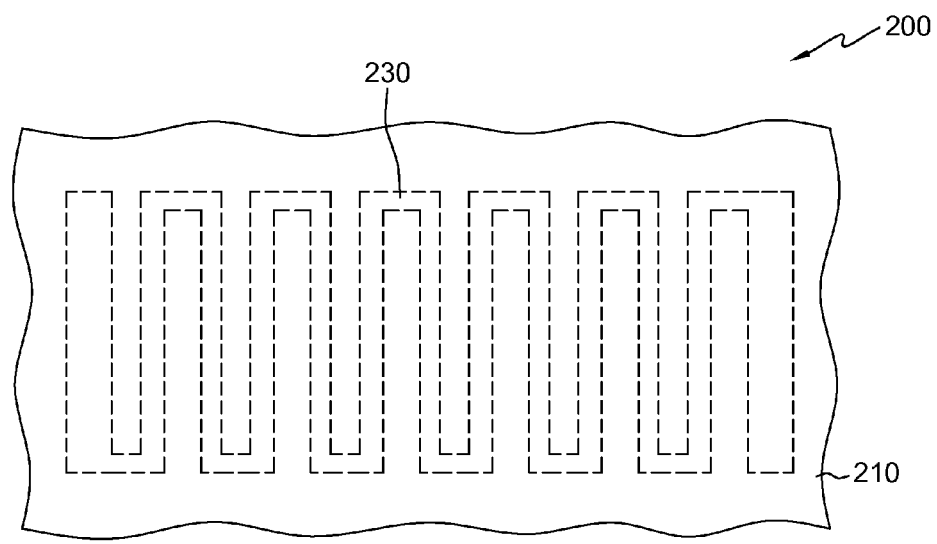
FIG. 2F depicts the structure of FIG. 2E, after filling the insulator layer, in accordance with one or more aspects of the present invention.

FIG. 2F depicts structure 200, after extending or filling insulator layer 210, in accordance with one or more aspects of the present invention. In one or more embodiments, an insulator material may be deposited over structure 200 and subsequently planarized, in order to completely dispose conductive coil 230 within the insulator material.

Figure 2G:
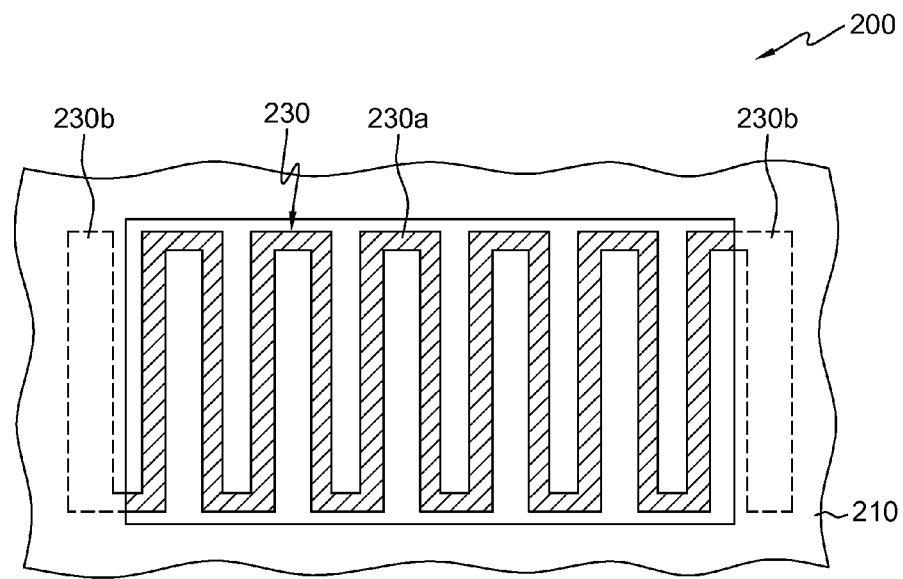
FIG. 2G depicts the structure of FIG. 2F, after removing portions of the insulator layer to form a cavity and expose portions of the conductive coil, in accordance with one or more aspects of the present invention.
Figure 2H:
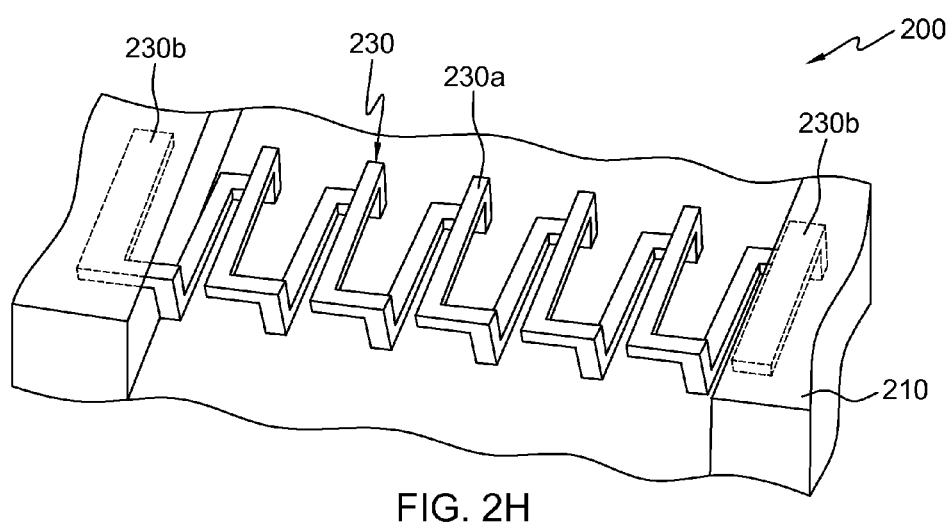
FIG. 2H is a three-dimensional view of the structure of FIG. 2G, in accordance with one or more aspects of the present invention.

FIGS. 2G-2H depicts structure 200 after removing portions of insulator layer 210 to form a cavity 240 and expose portions of conductive coil 230, in accordance with one or more aspects of the present invention.

In one embodiment, insulator layer 210 may be masked and etched to expose portions 230a of conductive coil 230, using, for example one or more of isotropic and anisotropic etching. In such a case, for example, the etching may include laterally etching insulator layer 210 to facilitate exposing lower portions of conductive coil 230. For instance, an isolation material with a greater etching rate than surrounding material may have been disposed below portions of conductive coil 230 to facilitate the lateral etching so that the bottoms of conductive coil 230 are completely exposed.

In the illustrated embodiment, after the removing, portion 230a of conductive coil 230 is exposed in cavity 240, and other portions 230b of conductive coil 230 are not exposed, and remain embedded within insulator layer 210.

As depicted, conductive coil 230 is aligned with an axis substantially parallel to an upper surface of insulator layer 210. In one example, a magnetic field induced in conductive coil 230 may be oriented parallel to the upper surface of insulator layer 210, along the axis of conductive coil 230.

Figure 2I:
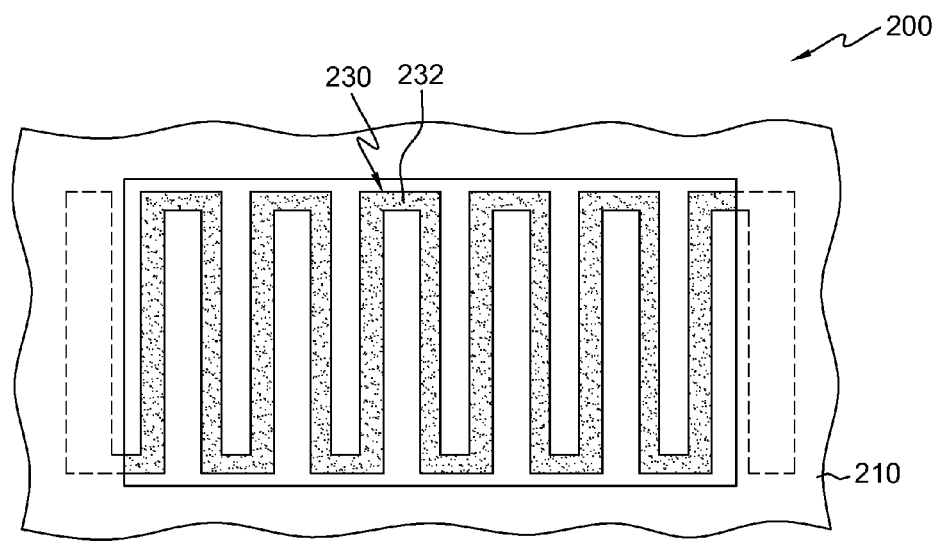
FIG. 2I depicts the structure of FIG. 2H, after covering the exposed portions of the conductive coil with a dielectric material, in accordance with one or more aspects of the present invention.

FIG. 2I depicts structure 200, after covering the exposed portions 230a (FIG. 2H) of conductive coil 230 with a dielectric material 232, in accordance with one or more aspects of the present invention. For example, dielectric material 232 may be a high dielectric constant (high-k) material having a dielectric constant greater than, for example, approximately 3.9 (the dielectric constant of silicon dioxide), including, but not limited to one or more of hafnium oxide, tantalum oxide, zirconium oxide, titanium oxide, or aluminum oxide. Any suitable deposition process, such as chemical vapor deposition (CVD) may be used to cover, coat, or cause to be deposited, the exposed portions of conductive coil 230 (e.g., portions 230a of FIG. 2H) with dielectric material 232.

In one embodiment, a liner material may be deposited over dielectric material 232. For example, the liner material may be titanium nitride. In one example, the liner material may be used to inhibiting damage to dielectric material 232 during subsequent processing steps described herein. In another example, the liner material may be used to encourage (e.g., as a seed material) uniform deposition of an electrode material over conductive coil 230.

Figure 2J:
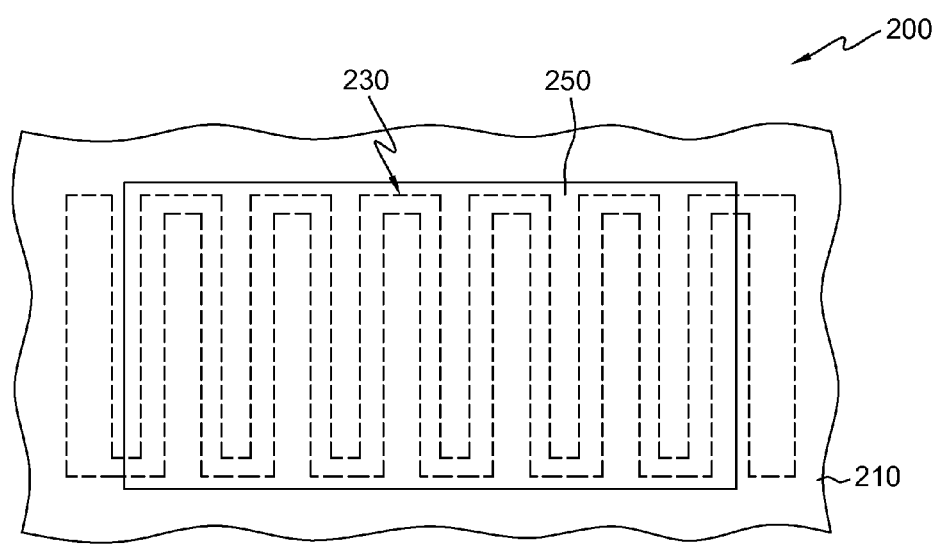
FIG. 2J depicts the structure of FIG. 2I, after filling the cavity of the insulator layer with an electrode, in accordance with one or more aspects of the present invention.

FIG. 2J depicts structure 200, after filling cavity 240 of insulator layer 210 with an electrode 250, in accordance with one or more aspects of the present invention.

In one embodiment, a conductive material, such as copper, may be deposited within cavity 240 (FIG. 2I) to form electrode 250. In another embodiment, cavity 240 may be completely filled to overflowing with a conductive material, and a subsequent CMP or other planarizing processing step may be used to remove excess portions of electrode 250.

In the illustrated embodiment, middle portions 230a (FIG. 2I) of conductive coil 230 are completely embedded within electrode 250. For example, as depicted in the isometric view of FIG. 2H, electrode 250 is situated for direct contact with a contact structure, however further portions (i.e., portions 230b of FIG. 2I) of conductive coil 230 remain embedded within insulator layer 210.

Figure 2K:
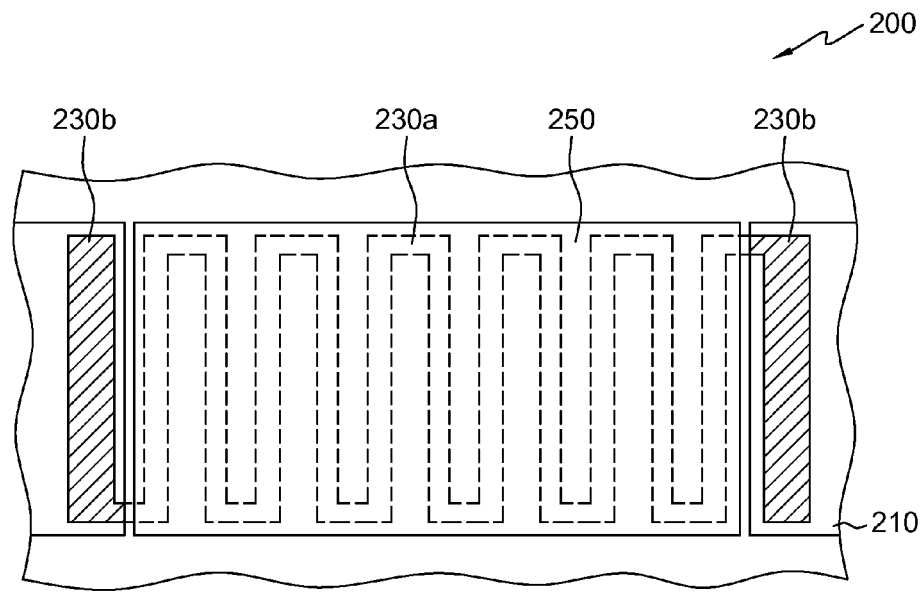
FIG. 2K depicts the structure of FIG. 2J, after exposing further portion(s) of the conductive coil, in accordance with one or more aspects of the present invention.

FIG. 2K depicts structure 200, after exposing further portion(s) 230b of conductive coil 230, in accordance with one or more aspects of the present invention. For example, end portions 230b conductive coil 230 may be exposed by etching insulator layer 210 of structure 200 without etching electrode 250. In one embodiment, electrode 250 may itself be a mask for etching insulator layer 210 to only reveal portions 230b of conductive coil 230, using any suitable selective etching process.

Figure 2L:
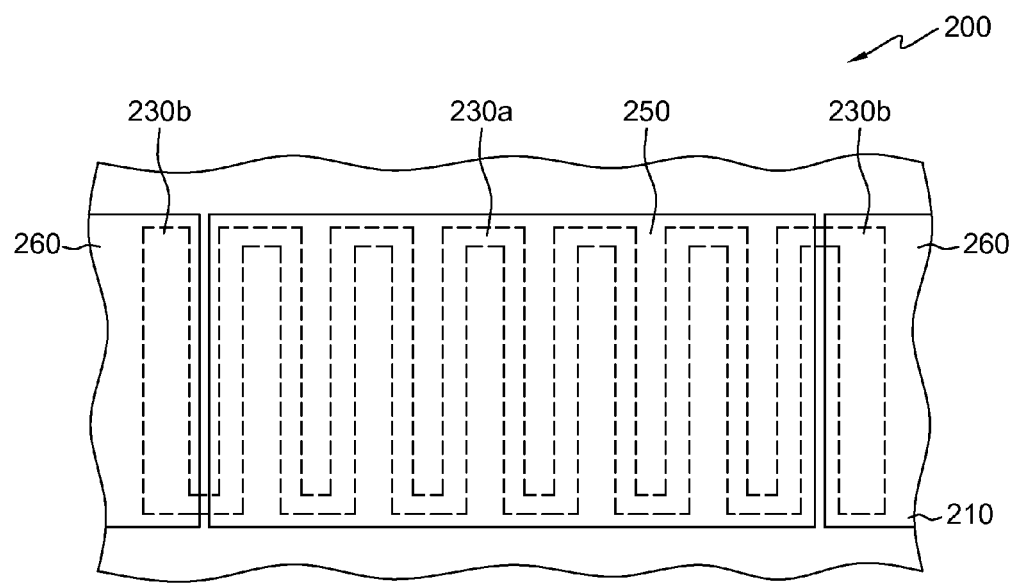
FIG. 2L depicts the structure of FIG. 2K, after providing another electrode in contact with the further exposed portion(s) of the conductive coil, in accordance with one or more aspects of the present invention.

FIG. 2L depicts structure 200, after providing another electrode 260 in contact with the further exposed portion(s) 230b of conductive coil 230, in accordance with one or more aspects of the present invention.

In one or more embodiments, contact structures 260 may then be provided in electrical contact with portions 230b of conductive coil 230. In one embodiment, contact structure 260 may be deposited using photolithographic patterning and masking techniques after revealing the target area of portions 230b, followed by deposition of a conductive material over portions 230b.

By way of summary, FIGS. 2A-2L depict embodiments of a process for forming an integrated device having an inductive portion and a capacitive portion. In one example, conductive coil 230 includes the inductive portion of the integrated device. In another example, the capacitive portion of the integrated device includes electrode 250, the dielectric material, and conductive coil 230.

In one implementation, contact structures 260 may be used as two terminals to electrically connect the inductive portion of the integrated device. In another implementation, electrode 250 and one or both contact structures 260 may be used as terminals to electrically connect the capacitive portion of the integrated device. In a further implementation, one of contact structures 260 may be connected to electrode 250 to connect the capacitive and inductive portions of the integrated device in a series electrical connection. In another implementation, both contact structures 260 may be connected to electrode 250 to connect the capacitive and inductive portions in a parallel electrical connection.

Figure 3A:
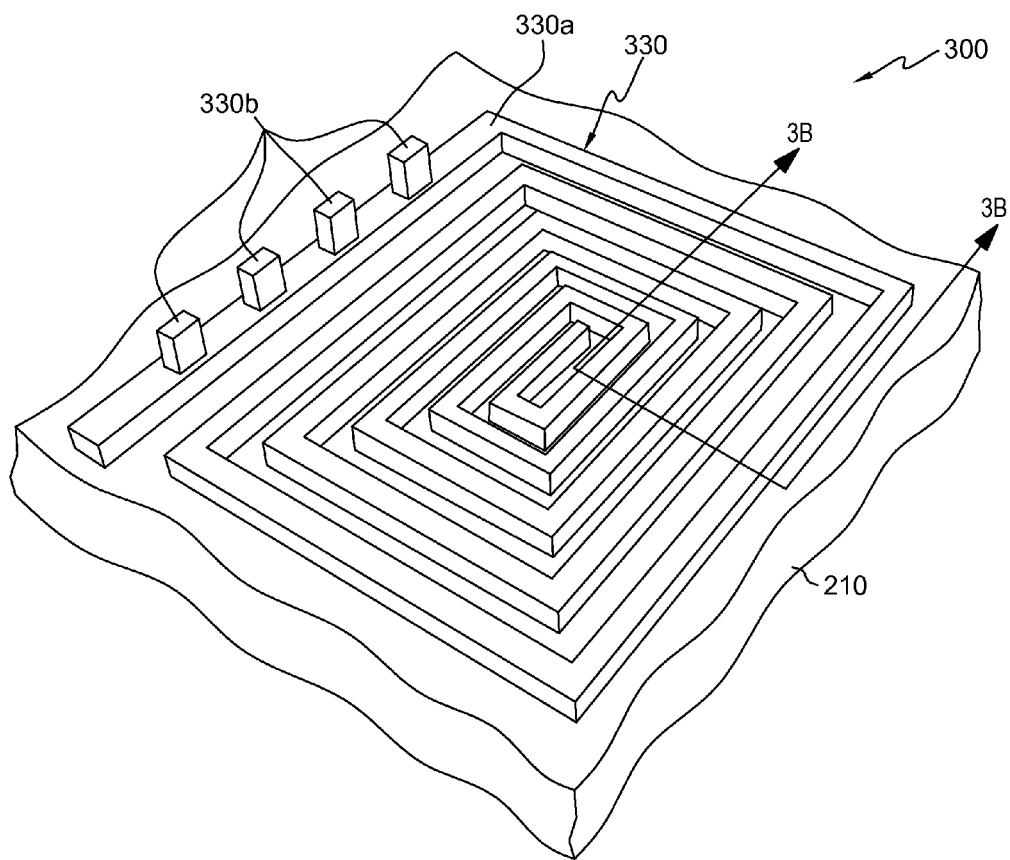
FIG. 3A depicts a structure found in integrated device fabrication, in accordance with one or more aspects of the present invention.

FIG. 3A depicts a structure 300 found in integrated device fabrication, in accordance with one or more aspects of the present invention. In the illustrated embodiment, structure 300 includes a conductive coil 330. In one or more embodiments, conductive coil 330 is aligned with an axis substantially perpendicular to an upper surface of insulator layer 210. In such a case, for example, a magnetic field induced in conductive coil 330 may be aligned perpendicular to insulator layer 210.

Figure 3B:
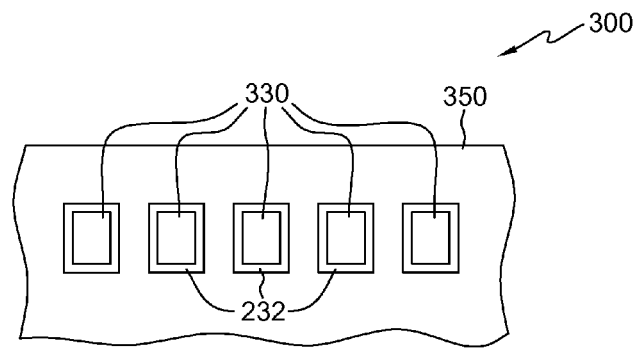
FIG. 3B depicts the structure of FIG. 3A after providing a dielectric material over an inductive coil thereof, in accordance with one or more aspects of the present invention.

FIG. 3B depicts structure 300, after providing a dielectric material 232 over inductive coil 330 and forming electrode 350, in accordance with one or more aspects of the present invention. In one or more embodiments, the processes described above may be used to cover portions of conductive coil 330 with dielectric material 232, followed by forming electrode 350 over dielectric covered portions of conductive coil 330. In such a manner, a device with an inductive portion and a conductive portion may be formed. In one example, portions 330b may be uncovered by the dielectric, and may be used to contact the conductive coil.

By way of further examples, in other embodiments, the techniques disclosed herein may be used to form capacitor structures with embedded electrodes. For instance, the capacitor structure may include: first electrodes disposed at least partially within an insulator layer above a substrate; a dielectric material covering portions of the first electrodes;

and a second electrode disposed at least partially around the dielectric covered portions of the first electrodes, the second electrode being physically separated from the first electrodes by the dielectric material, and the first electrodes being at least partially embedded within the second electrode.

In one embodiment, the capacitor structure further includes a contact structure, the contact structure being in electrical contact with other portions of the first electrodes. In another embodiment, the capacitor structure further includes a liner material, the liner material being disposed over the dielectric covered portions of the first electrodes and inhibiting damage to the dielectric material from the second electrode. In a further embodiment, some of the first electrodes are aligned substantially parallel to a first direction and other of the first electrodes are aligned substantially parallel to a second direction, the first and second directions being different directions.

In one example, the first electrodes include multiple stacked layers of electrodes. In another example, the first electrodes are spaced apart with a characteristic spacing. In another example, the first electrodes are aligned substantially parallel and coplanar. In a further example, the capacitor structure further includes a contact structure, the contact structure being in electrical contact with the second electrode.

In another implementation, fabricating a capacitor structure having first electrode partially embedded within a second electrode includes, for instance: providing the first electrodes at least partially within an insulator layer; covering exposed portions of the first electrodes with a dielectric material; and forming the second electrode at least partially around the dielectric covered portions of the first electrodes, the second electrode being physically separated from the first electrodes by the dielectric material.

In one embodiment, the fabricating further includes: exposing further portions of the first electrodes; and providing a contact structure in electrical contact with the further exposed portions of the first electrodes. In another embodiment, the providing includes forming the first electrodes within a cavity of the insulator layer, where the exposed portions of the first electrodes are exposed within the cavity of the insulator layer. In a further embodiment, the forming includes filling the cavity of the insulator layer with the second electrode.

In one embodiment, the providing includes removing portions of the insulator layer to form the cavity and expose the exposed portions of the first electrodes. In another embodiment, the providing includes: forming trenches in the insulator layer; forming the first electrodes within the trenches of the insulator layer; and etching the insulator layer to expose the exposed portions of the first electrodes. In such a case, for example, the etching may include laterally etching the insulator layer to facilitate exposing lower portions of the first electrodes. In a further embodiment, the fabricating further includes disposing, after the covering, a liner material over the dielectric covered portions of the first electrodes, the liner material inhibiting damage to the dielectric material during the forming.

In one embodiment, the providing includes aligning some of the first electrodes substantially parallel to a first direction and other of the first electrodes substantially parallel to a second direction, where the first and second directions are different directions. In another embodiment, the providing includes stacking the first electrodes in multiple layers over the insulator layer. In another embodiment, the providing includes spacing apart the first electrodes with a characteristic spacing. In a further embodiment, the providing includes aligning the first electrodes to be substantially parallel and coplanar.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or integrated device that "comprises," "has," "includes," or "contains" one or more steps or elements possesses those one or more steps or elements, but is not limited to possessing only those one or more steps or elements. Likewise, a step of a method or an element of an integrated device that "comprises," "has," "includes," or "contains" one or more features possesses those one or more features, but is not limited to possessing only those one or more features. Furthermore, an integrated device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating an integrated device comprising an inductive portion and a capacitive portion, the fabricating comprising:
   providing a conductive coil at least partially within an insulator layer above a substrate, the conductive coil comprising exposed portions, wherein the inductive portion of the integrated device comprises the conductive coil;
   covering exposed portions of the conductive coil with a dielectric material;
   forming the electrode of the integrated device at least partially around the dielectric covered portions of the conductive coil, the electrode being physically separated from the conductive coil by the dielectric material, wherein the capacitive portion of the integrated device comprises the electrode, the dielectric material, and the conductive coil; and
   producing another electrode in electrical contact with at least one further portion of the conductive coil.

2. The method of claim 1, further comprising:
   exposing the at least one further portion of the conductive coil.

3. The method of claim 1, wherein the providing comprises forming the conductive coil within a cavity of the insulator layer, wherein the exposed portions of the conductive coil are exposed within the cavity of the insulator layer.

4. The method of claim 3, wherein the forming comprises filling the cavity of the insulator layer with the electrode.

5. The method of claim 3, wherein the providing comprises removing portions of the insulator layer to form the cavity and expose the exposed portions of the conductive coil.

6. The method of claim 1, wherein the providing comprises:
forming trenches in the insulator layer;
forming the conductive coil within the trenches of the insulator layer; and
etching the insulator layer to expose the exposed portions of the conductive coil.

7. The method of claim 6, wherein the etching comprises laterally etching the insulator layer to facilitate exposing lower portions of the conductive coil.

8. The method of claim 1, further comprising disposing, after the covering, a liner material over the dielectric covered portions of the conductive coil, the liner material inhibiting damage to the dielectric material during the forming.

9. The method of claim 1, wherein the providing comprises aligning the conductive coil with an axis substantially parallel to an upper surface of the insulator layer.

10. The method of claim 1, wherein the providing comprises aligning the conductive coil with an axis substantially perpendicular to an upper surface of the insulator layer.

11. The method of claim 1, wherein the fabricating further comprises forming at least one interconnect structure, wherein the at least one interconnect structure connects the inductive portion and the capacitive portion of the integrated device in a series electrical connection.

12. The method of claim 1, wherein the fabricating further comprises forming at least one interconnect, wherein the at least one interconnect structure connects the inductive portion and the capacitive portion of the integrated device in a parallel electrical connection.

13. The method of claim 1, wherein the forming comprises at least partially embedding the conductive coil within the electrode of the integrated device.

14. An integrated device comprising:
a conductive coil, the conductive coil comprising an inductive portion of the integrated device;
a dielectric material, the dielectric material covering exposed portions of the conductive coil;
an electrode, the electrode being disposed at least partially around the dielectric covered portions of the conductive coil and being physically separated from the conductive coil by the dielectric material, wherein a capacitive portion of the integrated device comprises the electrode, the dielectric material, and the conductive coil; and
another electrode in electrical contact with at least one further portion of the conductive coil.

15. The integrated device of claim 14, further comprising a liner material, the liner material being disposed over the dielectric covered portions of the conductive coil and inhibiting damage to the dielectric material from the electrode.

16. The integrated device of claim 14, wherein the conductive coil is aligned with an axis substantially parallel to an upper surface of an insulator layer.

17. The integrated device of claim 14, wherein the conductive coil is aligned with an axis substantially perpendicular to an upper surface of an insulator layer.

18. The integrated device of claim 14, further comprising at least one interconnect structure, the at least one interconnect structure connecting the inductive portion and the capacitive portion of the integrated device in a series electrical connection.

19. The integrated device of claim 14, further comprising at least one interconnect structure, the at least one interconnect structure connecting the inductive portion and the capacitive portion of the integrated device in a parallel electrical connection.

20. A method comprising:
fabricating an integrated device comprising an inductive portion and a capacitive portion, the fabricating comprising:
providing a conductive coil at least partially within an insulator layer above a substrate, the conductive coil comprising exposed portions, wherein the inductive portion of the integrated device comprises the conductive coil;
covering exposed portions of the conductive coil with a dielectric material;
forming the electrode of the integrated device at least partially around the dielectric covered portions of the conductive coil, the electrode being physically separated from the conductive coil by the dielectric material, wherein the capacitive portion of the integrated device comprises the electrode, the dielectric material, and the conductive coil;
producing another electrode in electrical contact with at least one further portion of the conductive coil and further comprising disposing, after the covering, a liner material over the dielectric covered portions of the conductive coil, the liner material inhibiting damage to the dielectric material during the forming; and
disposing, after the covering, a liner material over the dielectric covered portions of the conductive coil, the liner material inhibiting damage to the dielectric material during the forming.

* * * * *